US009872394B2

(12) United States Patent
Cordes et al.

(10) Patent No.: US 9,872,394 B2
(45) Date of Patent: Jan. 16, 2018

(54) SUBSTRATE VIA FILLING

(71) Applicant: International Business Machines Corporation, Armonk, NY (US)

(72) Inventors: Steven A. Cordes, Yorktown Heights, NY (US); Bing Dang, Chappaqua, NY (US); Sung K. Kang, Chappaqua, NY (US); Yu Luo, Hopewell Junction, NY (US); Peter J. Sorce, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/090,656

(22) Filed: Apr. 5, 2016

(65) Prior Publication Data

US 2016/0219715 A1 Jul. 28, 2016

Related U.S. Application Data

(63) Continuation of application No. 14/515,567, filed on Oct. 16, 2014, now Pat. No. 9,433,101.

(51) Int. Cl.
*B05D 5/12* (2006.01)
*H05K 3/00* (2006.01)
(Continued)

(52) U.S. Cl.
CPC ....... *H05K 3/0094* (2013.01); *C23C 18/1646* (2013.01); *C23C 18/1653* (2013.01);
(Continued)

(58) Field of Classification Search
CPC combination set(s) only.
See application file for complete search history.

(56) References Cited

U.S. PATENT DOCUMENTS

| 4,135,988 A | 1/1979 | Dugan et al. |
| 4,954,313 A | 9/1990 | Lynch |

(Continued)

FOREIGN PATENT DOCUMENTS

| GB | 1357661 | 6/1974 |
| GB | 2035908 A | 6/1980 |
| GB | 2035908 B | 6/1980 |

OTHER PUBLICATIONS

Ordes et al., "Substrate Via Filling", U.S. Appl. No. 14/515,567, filed Oct. 16, 2014, 18 pages.

(Continued)

*Primary Examiner* — Austin Murata
(74) *Attorney, Agent, or Firm* — Steven F. McDaniel

(57) ABSTRACT

A method for filling vias with metal includes receiving a substrate having vias, forming a metal plating layer over the vias on a first side of the substrate, fill-plating the vias with a first metal beginning with the metal plating layer on the first side of the substrate and advancing to a second side of the substrate to provide filled vias. The metal plating layer may be subsequently patterned to provide selected circuit connections or chemically-mechanically polished to completely remove the metal plating layer. Forming a metal plating layer over the vias may include filling the vias with a sacrificial filler to enable formation of the metal plating layer and subsequently removing the sacrificial filler via an etching operation or the like. In other embodiments, forming the metal plating layer over the vias is accomplished by bonding a metallic layer onto the first side of the substrate.

18 Claims, 4 Drawing Sheets

(51) Int. Cl.
*C25D 5/02* (2006.01)
*C25D 7/00* (2006.01)
*H05K 3/42* (2006.01)
*C23C 18/16* (2006.01)
*H05K 3/38* (2006.01)

(52) U.S. Cl.
CPC ............ *C23C 18/1689* (2013.01); *C25D 5/02* (2013.01); *C25D 7/00* (2013.01); *H05K 3/424* (2013.01); *C23C 18/1603* (2013.01); *H05K 3/388* (2013.01); *H05K 2203/072* (2013.01); *H05K 2203/0723* (2013.01); *H05K 2203/308* (2013.01)

(56) References Cited

U.S. PATENT DOCUMENTS

| | | | |
|---|---|---|---|
| 5,818,404 A | 10/1998 | Lebby et al. | |
| 6,138,350 A | 10/2000 | Bhatt et al. | |
| 6,506,332 B2 | 1/2003 | Pedigo | |
| 6,938,653 B2 | 9/2005 | Sakaida et al. | |
| 7,437,030 B2 | 10/2008 | Asai et al. | |
| 7,449,067 B2 | 11/2008 | Andry et al. | |
| 7,526,152 B2 | 4/2009 | Asai et al. | |
| 9,105,628 B1 | 8/2015 | Dubin | |
| 9,224,681 B2 | 12/2015 | Ebefors et al. | |
| 9,275,934 B2 | 3/2016 | Sundaram et al. | |
| 2003/0058630 A1* | 3/2003 | Takano ................ | H01L 23/10 361/783 |
| 2004/0096592 A1* | 5/2004 | Chebiam ................ | C23C 18/34 427/443.1 |
| 2004/0134682 A1* | 7/2004 | En ........................ | C23C 18/1607 174/258 |
| 2004/0234777 A1 | 11/2004 | Grunwald | |
| 2013/0099238 A1 | 4/2013 | Chen et al. | |
| 2013/0099358 A1* | 4/2013 | Elolampi ................ | H01L 23/13 257/618 |
| 2013/0299950 A1* | 11/2013 | Hummler ............ | H01L 23/3677 257/622 |
| 2015/0076561 A1* | 3/2015 | Cheng ................ | H01L 27/1211 257/192 |

OTHER PUBLICATIONS

IBM Appendix P, list of patents and patent applications treated as related, Apr. 5, 2016, 2 pages.

* cited by examiner

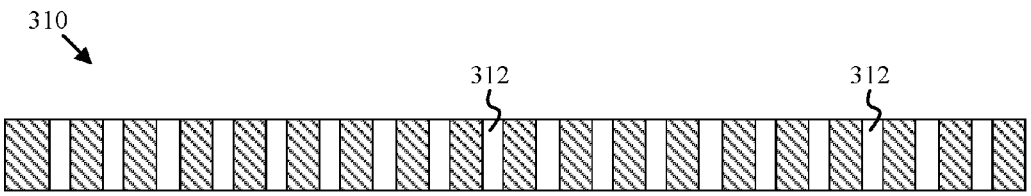
Fig. 3a
Fig. 3b
Fig. 3c
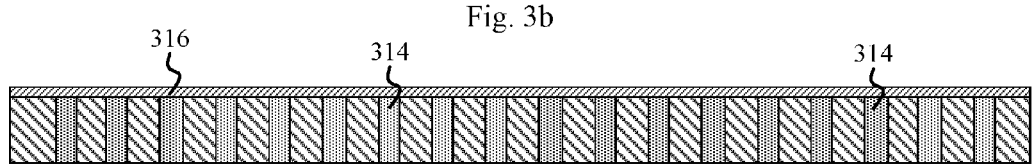
Fig. 3d
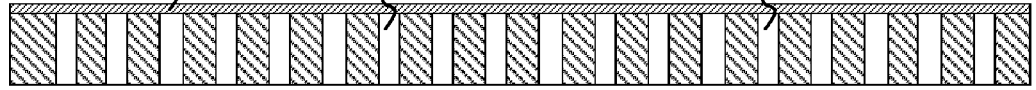
Fig. 3e
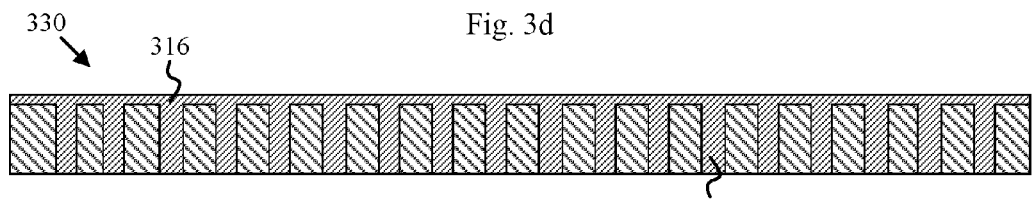
Fig. 3f
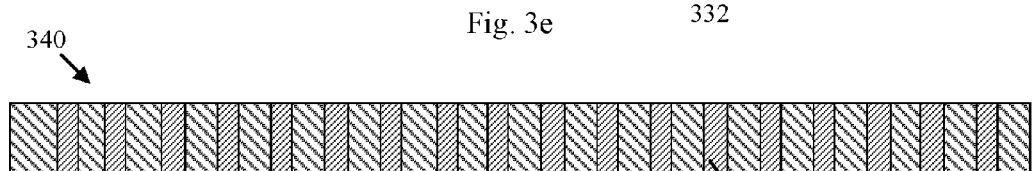
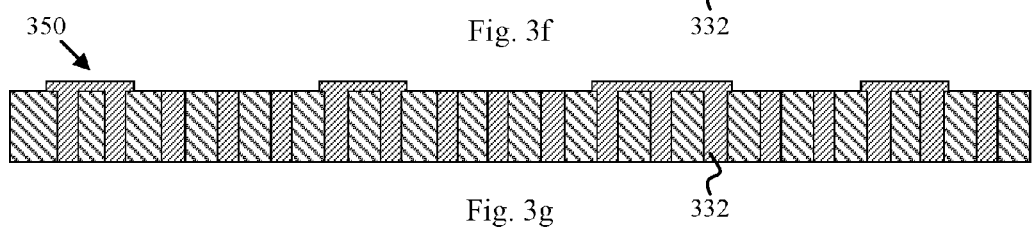
Fig. 3g

SUBSTRATE VIA FILLING

BACKGROUND OF THE INVENTION

The present invention relates generally to substrate manufacturing and more particularly to filling vias in substrates such as glass interposers.

Glass interposers are receiving more and more attention for various applications including 3D/2.5D integration and RF component integration. Ultra-thin glass substrates with through vias are now commercially available. However, high aspect-ratio via filling and handling remain a challenge.

SUMMARY

A method for filling vias with metal includes receiving a substrate having vias, forming a metal plating layer over the vias on a first side of the substrate, fill-plating the vias with a first metal—beginning with the metal plating layer on the first side of the substrate and advancing to a second side of the substrate—to provide filled vias. The metal plating layer may be subsequently patterned to provide selected circuit connections or chemically-mechanically polished to completely remove the metal plating layer.

Forming a metal plating layer over the vias may include filling the vias with a sacrificial filler to enable formation of the metal plating layer, and subsequently removing the sacrificial filler via an etching operation, or the like. In other embodiments, forming the metal plating layer over the vias is accomplished by bonding a metallic layer onto the first side of the substrate. The vias may be etched to remove any bonding adhesive previous to the fill-plating.

BRIEF DESCRIPTION OF THE DRAWINGS

FIGS. 3a-3g are cross-sectional illustrations of a substrate processed according to a first embodiment of the method of FIG. 2;

DETAILED DESCRIPTION

The embodiments disclosed herein enable via filling in thin substrates at high packing densities and aspect ratios such as is needed for glass interposers. It should be noted that references throughout this specification to features, advantages, or similar language do not imply that all of the features and advantages that may be realized with the present invention should be, or are in, any single embodiment of the invention. Rather, language referring to the features and advantages is understood to mean that a specific feature, advantage, or characteristic described in connection with an embodiment is included in at least one embodiment of the present invention. Thus, discussion of the features, advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following description and appended claims, or may be learned by the practice of the invention as set forth hereinafter.

Figure 1:
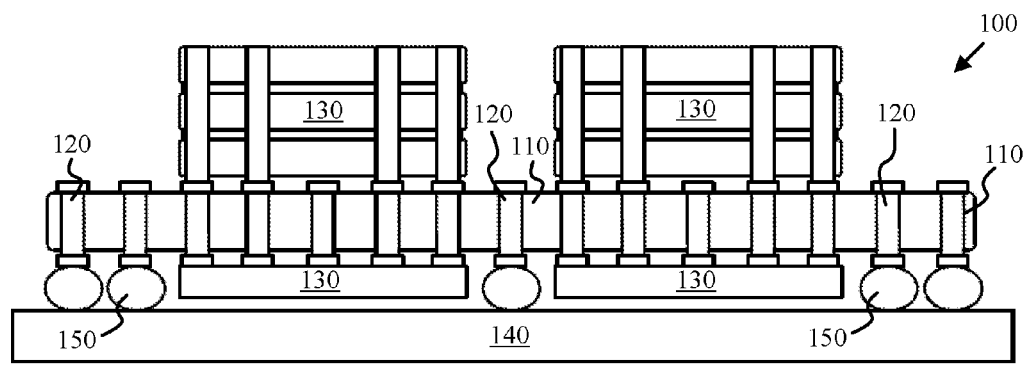
FIG. 1 is a cross-sectional view illustration depicting one embodiment of an interposing packaging system that may be enabled by at least some of the embodiments disclosed herein.

The embodiments disclosed herein enable via filling in thin substrates at high packing densities and aspect ratios such as is needed for glass interposers. For example, FIG. 1 is a cross-sectional view illustration depicting one embodiment of an interposing packaging system 100 that may be enabled by at least some of the embodiments disclosed herein. As depicted, the interposing packaging system 100 includes an interposer 110 with filled vias 120 that provide electrical connectivity to various integrated circuits 130 mounted above and below the interposer 110. The interposer 110 also provides electrical connectivity to a printed circuit board 140 via various solder connections 150.

The integrated circuits 130 mounted on the interposer 110 may have a connection (i.e., I/O) density that is greater than the connection density achievable on the printed circuit board 140. Consequently, the interposer 110 facilitates electrical connectivity between the integrated circuits 130 and the printed circuit board 140 and may have various routed traces thereon (not shown) to facilitate the required electrical connectivity in addition to the filled vias 120.

Despite the utility of the interposer 110, reliable and cost effective filling of the vias has been difficult. For example, filling high aspect ratio vias within glass interposers often results in cracking, plating pinch-off, and incomplete filling. The present invention was developed in response to these issues.

Figure 2:
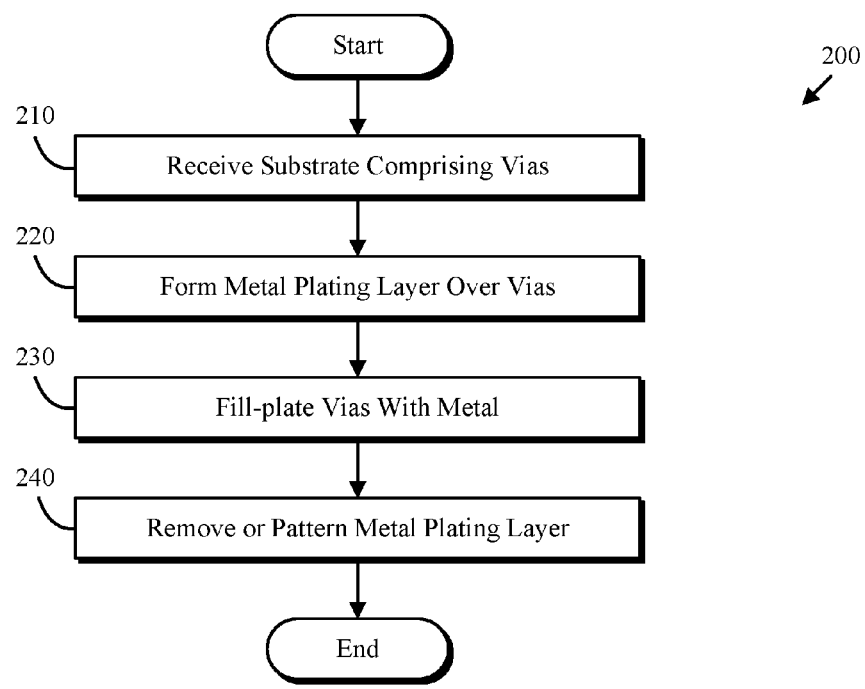
FIG. 2 is a flowchart depicting a via-filling method in accordance with the present invention.

FIG. 2 is a flowchart depicting a via-filling method 200 in accordance with the present invention. As depicted, via-filling method 200 includes receiving (210) a substrate comprising vias, forming (220) a metal plating layer over the vias, fill-plating (230) the vias, and removing or patterning (240) the metal plating layer. The via-filling method 200 enables the filling of vias that have high aspect ratios (e.g. greater than 5:1) and packing densities (e.g. with a via pitch of less than 100 um).

Receiving (210) may include receiving a substrate with vias formed therein. For example, the vias may be formed with water jets, electric discharge, or lasers. Forming (220) a metal plating layer over the vias may include one of several approaches. In one embodiment, a metal foil is bonded onto one side of the substrate. In another embodiment, a sacrificial material is inserted into the vias and the metal layer is deposited on one side of the substrate. Subsequently, the sacrificial material may be removed via etching or the like.

Fill-plating (230) the vias may be conducted according to methods known to those skilled in the art—beginning with the metal plating layer on a first side of the substrate and advancing through the via toward a second side of the substrate. For example, the vias may be fill-plated with a metal by an electroplating process known to those of skill in the art. Removing or patterning (240) the metal plating layer may include completely removing the metal plating layer or patterning the metal plating layer by selectively removing a portion of the metal plating layer. Patterning the metal plating layer may result in signal traces between selected filled vias.

FIGS. 3a-3g are cross-sectional illustrations of a substrate processed according to a first embodiment of the method of FIG. 2. As shown in FIG. 3a substrate 310 comprising vias 312 may be received and filled with a sacrificial material 314 as shown in FIG. 3b. Examples of a sacrificial material include photoresist, PMMA, and various low solvent polymers. As shown in FIG. 3c, a metal plating layer 316 may be formed over the vias 312. Subsequently, the sacrificial material 314 may be removed as shown in FIG. 3d to provide a fillable substrate 320.

As shown in FIG. 3e, the vias 312 of the fillable substrate 320 may be fill-plated with a fill metal 332 beginning with the metal plating layer 316 on one side of the substrate and advancing through the via toward the other side of the substrate resulting in a filled substrate 330. Subsequently, the metal plating layer 316 may be completely removed resulting in the finished substrate 340 shown in FIG. 3f. Alternatively, the metal plating layer 316 may be patterned resulting in the patterned substrate 350 shown in FIG. 3g.

Figure 4A:
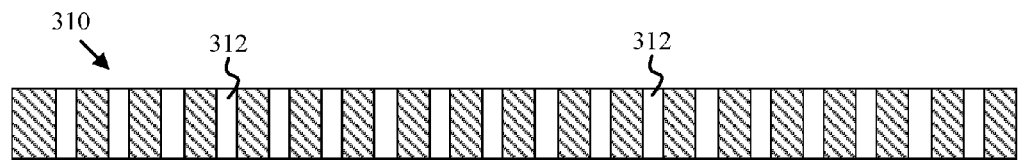
FIGS. 4a-4e are cross-sectional illustrations of a substrate processed according to a second embodiment of the method of FIG. 2.
Figure 4B:
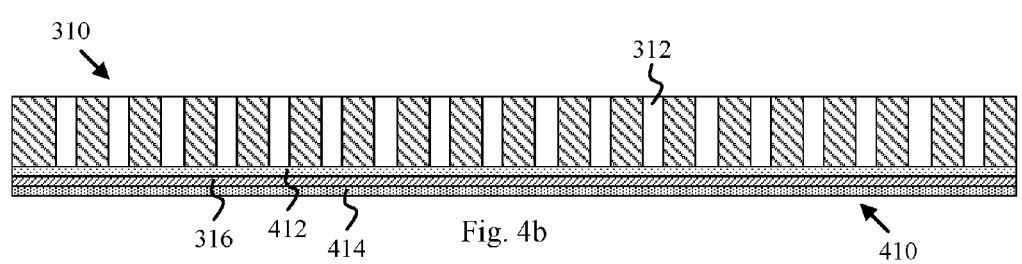
Figure 4C:
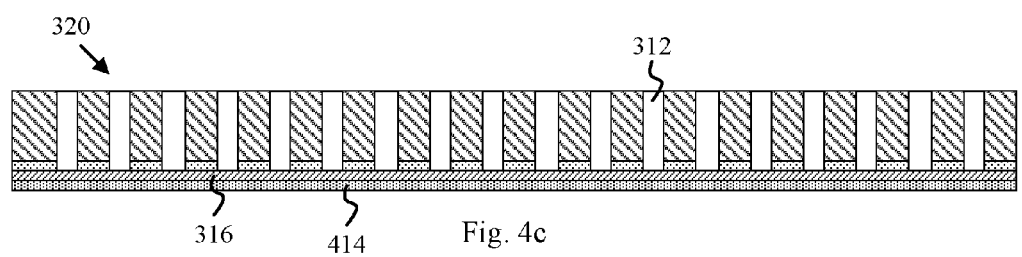
Figure 4D:
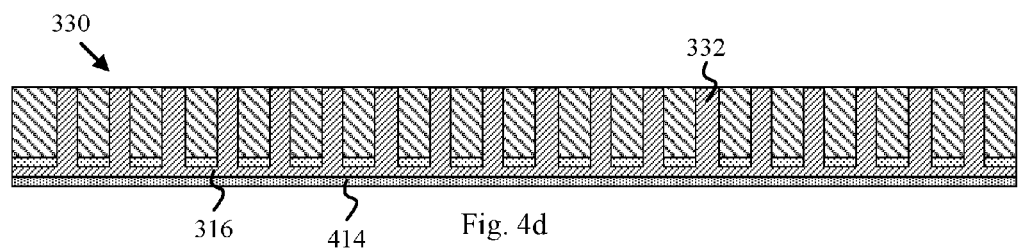
Figure 4E:
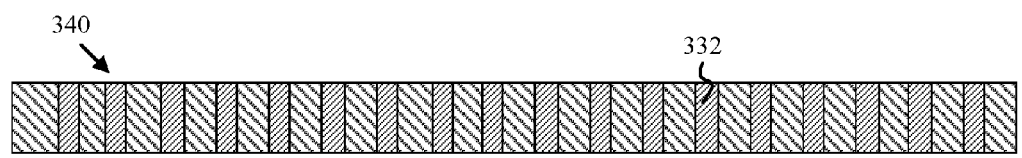

FIGS. 4a-4e are cross-sectional illustrations of a substrate processed according to a second embodiment of the method of FIG. 2. As shown in FIG. 4a, substrate 310 comprising vias 312 may be received and bonded to a metallic foil 410 as shown in FIG. 4b. In the depicted embodiment, the metallic foil includes an adhesive layer 412, the metal plating layer 316, and a backing layer 414. The backing layer 414 may be rigid or flexible. The adhesive at the bottom of the vias may be removed by an etching process, or the like, through vias 312, to expose the metal plating layer 316 and provide the fillable substrate 320 shown in FIG. 4c. The fillable substrate 320 may undergo fill-plating to provide filled substrate 330 shown in FIG. 4d. Subsequently, as shown in FIG. 4e the metal plating layer 316 may be removed to provide the finished substrate 340. Alternately, the metal plating layer 316 may be patterned to provide the patterned substrate 340 (not shown in FIGS. 4a-4e).

Figure 5A:
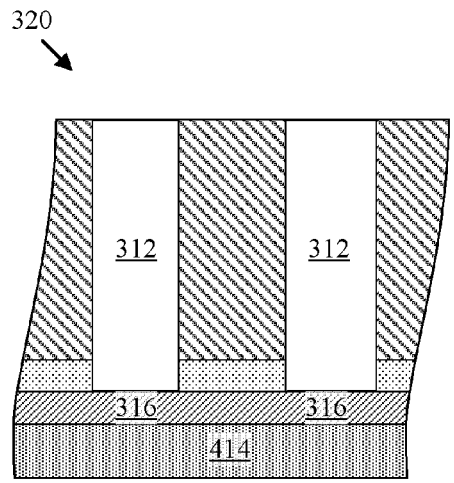
FIGS. 5a-5d are cross-sectional illustrations of a substrate undergoing a sidewall adhesion and via filling process in accordance with an embodiment of the present invention.
Figure 5B:
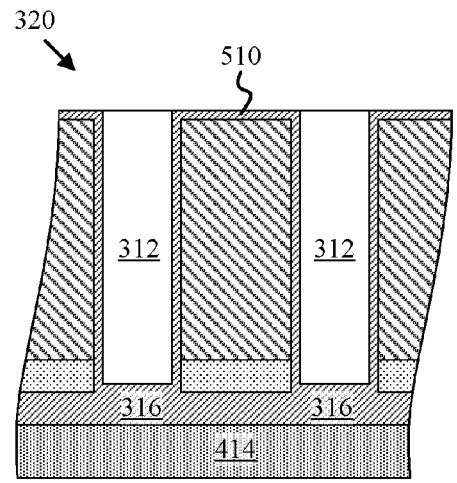
Figure 5C:
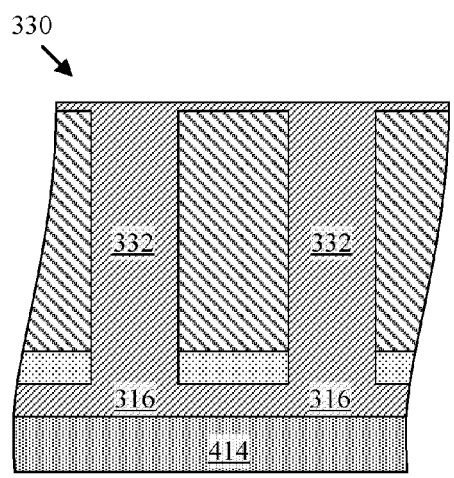

FIGS. 5a-5d are cross-sectional illustrations of a fillable substrate 320 undergoing a sidewall adhesion and via filling process in accordance with an embodiment of the present invention. As depicted in FIG. 5a, a fillable substrate 320 may be received and provided with an adhesion layer 510 as shown in FIG. 5b. For example, the adhesion layer 510 may be a metal that is deposited via chemical vapor deposition, physical vapor deposition, or electro-less plating. The adhesion layer 510 may have a CTE that is greater than the CTE of the fill-plated material and less than the CTE for the substrate.

Figure 5D:
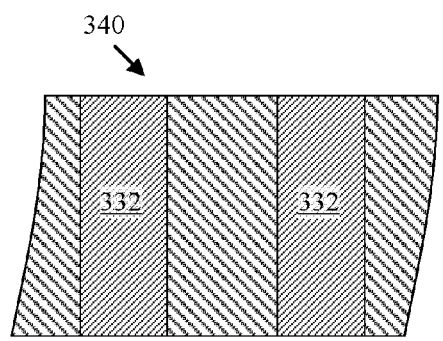

Subsequent to deposition of the adhesion layer 510, the fillable substrate 320 may be fill-plated with a fill metal 332. Fill-plating may advance primarily from the metal plating layer 316 on one side of the substrate but may also advance from the adhesion layer 510. In certain embodiments, the CTE of the fill metal 332 is controlled by co-depositing a metal with a relatively high CTE along with a low CTE material such as carbon nanotubes. In one embodiment, the CTE is varied with deposition depth to create a CTE gradient for the fill metal 332. For example, the CTE may be varied by reducing the deposition rate of the low CTE material as relative to the high CTE material as the vias are filled. The use of a CTE gradient may provide greater structure integrity for the filled vias over wide temperature ranges and swings. Subsequently, as shown in FIG. 5d, the filled substrate 330 may be patterned or chemically mechanically polished on one or both sides to provide a finished substrate 340 or a patterned substrate 350 (not shown in FIGS. 5a-5c).

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method for filling vias on a substrate with metal, the method comprising:
   receiving a substrate comprising a plurality of vias that extend through the entire substrate and form a void between a top surface of the substrate and a bottom surface of the substrate;
   forming a metal plating layer over the vias on a first side of the substrate to provide a fillable substrate;
   fill-plating the vias with a fill metal to provide a filled substrate; and
   removing at least a portion of the metal plating layer from the filled substrate to provide a finished substrate.

2. The method of claim 1, further comprising filling the vias with a sacrificial filler previous to forming the metal plating layer over the vias.

3. The method of claim 2, further comprising removing the sacrificial filler within the vias subsequent to forming the metal plating layer.

4. The method of claim 2, wherein filling the vias with a sacrificial filler comprises filling the vias with a solvent-based polymer and evaporating a solvent from the solvent-based polymer.

5. The method of claim 2, wherein forming the metal plating layer over the vias comprises depositing a metal.

6. The method of claim 1, wherein fill-plating comprises electroplating that generally progresses from the metal plating layer to a second side of the substrate.

7. The method of claim 1, wherein forming the metal plating layer over the vias comprises bonding a metallic layer onto the first side of the substrate.

8. The method of claim 1, further comprising depositing an adhesion layer onto the walls of the vias previous to fill-plating the vias.

9. The method of claim 8, wherein the adhesion layer comprises a metal.

10. The method of claim 8, wherein depositing occurs via electro-less plating.

11. The method of claim 1, wherein the fill metal has a coefficient of thermal expansion (CTE) that decreases toward the center of the vias.

12. The method of claim 1, wherein removing at least a portion of the metal plating layer comprises patterning the metal plating layer.

13. The method of claim 1, wherein removing at least a portion of the metal plating layer comprises chemical-mechanical polishing.

14. The method of claim 1, wherein a pitch for the vias is less than 100 um.

15. The method of claim 1, wherein the substrate is an interposer.

16. A method for filling vias on a substrate with metal, the method comprising:

receiving a substrate comprising a plurality of vias that extend through the entire substrate and form a void between a top surface of the substrate and a bottom surface of the substrate;
filling the vias with a sacrificial filler;
forming a metal plating layer over the vias on a first side of the substrate to provide a fillable substrate;
removing the sacrificial filler within the vias;
fill-plating the vias with a first metal to provide a filled substrate; and
removing at least a portion of the metal plating layer from the filled substrate to provide a finished substrate.

17. The method of claim 16, wherein fill-plating comprises electroplating that generally progresses from the metal plating layer to a second side of the substrate.

18. The method of claim 16, wherein filling the vias with a sacrificial filler comprises filling the vias with a solvent-based polymer and evaporating a solvent from the solvent-based polymer.

* * * * *